United States Patent
Maki et al.

(10) Patent No.: US 7,557,376 B2
(45) Date of Patent: Jul. 7, 2009

(54) DISPLAY DEVICE USING FIRST AND SECOND SEMICONDUCTOR FILMS OF DIFFERENT CRYSTALLINITY AND BOUNDARY SECTION THEREBETWEEN

(75) Inventors: Masahiro Maki, Mobara (JP); Hideo Sato, Hitachi (JP); Takayuki Nakao, Mobara (JP); Toshihiko Itoga, Chiba (JP)

(73) Assignee: Hitachi Displays, Ltd., Chiba-ken (JP)

(*) Notice: Subject to any disclaimer, the term of this patent is extended or adjusted under 35 U.S.C. 154(b) by 0 days.

(21) Appl. No.: 11/526,011

(22) Filed: Sep. 25, 2006

(65) Prior Publication Data
US 2007/0070283 A1 Mar. 29, 2007

(30) Foreign Application Priority Data
Sep. 26, 2005 (JP) .............................. 2005-277985

(51) Int. Cl.
*H01L 31/036* (2006.01)
(52) U.S. Cl. .......................................... 257/70; 257/72
(58) Field of Classification Search .................. 257/70, 257/72
See application file for complete search history.

(56) References Cited

U.S. PATENT DOCUMENTS

| 6,501,095 B2 | 12/2002 | Yamaguchi et al. |
| 6,713,324 B2 | 3/2004 | Shiba et al. |
| 6,949,452 B2 * | 9/2005 | Hatano et al. ............... 438/488 |
| 2004/0017365 A1 | 1/2004 | Hatano et al. |
| 2005/0230683 A1 * | 10/2005 | Yamaguchi et al. ........... 257/66 |

FOREIGN PATENT DOCUMENTS

| JP | 11-121753 | 4/1999 |
| JP | 2002-222957 | 8/2002 |
| JP | 2003-179068 | 6/2003 |
| JP | 2004-054168 | 2/2004 |

* cited by examiner

*Primary Examiner*—Jerome Jackson, Jr.
*Assistant Examiner*—Anthony Ho
(74) *Attorney, Agent, or Firm*—Antonelli, Terry, Stout & Kraus, LLP.

(57) ABSTRACT

The present invention provides an active matrix display device capable of raising its integration density by reducing the drive circuit area on the active matrix substrate. A semiconductor film presents in the boundary between a quasi-strip crystalline semiconductor film and another semiconductor film is used to form conductive lines, resistors, source/drain electrodes and the like which are respectively connected to thin film transistors formed using the quasi-strip crystalline semiconductor film.

8 Claims, 11 Drawing Sheets

FIG. 9
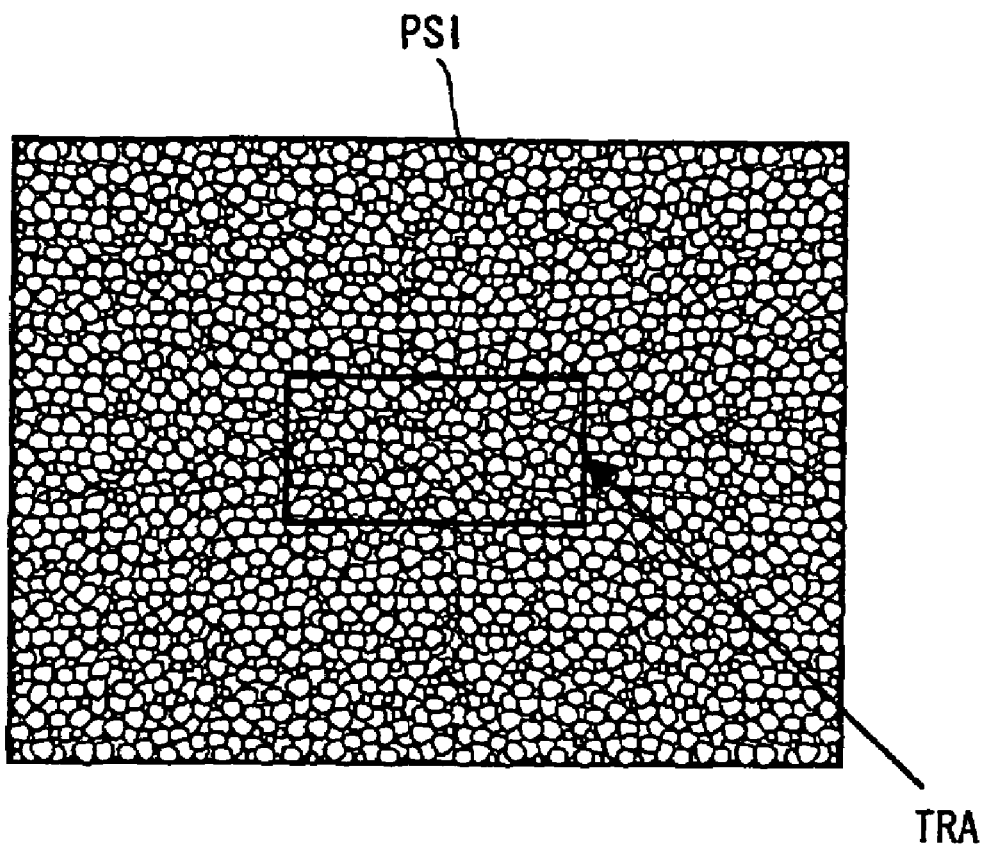
(a)
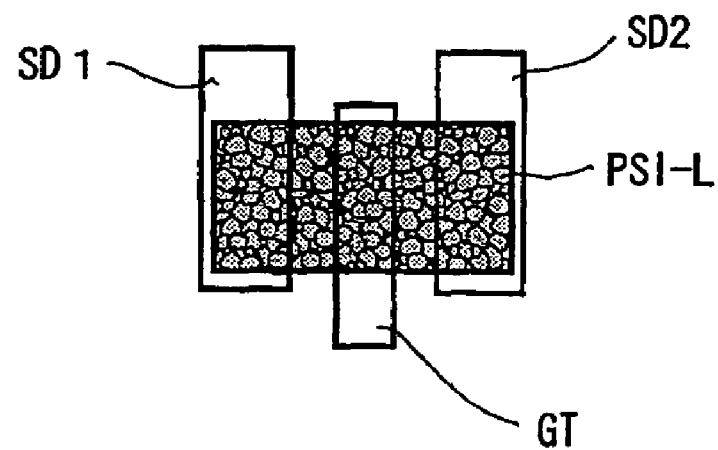
(b)

FIG. 10
(a)
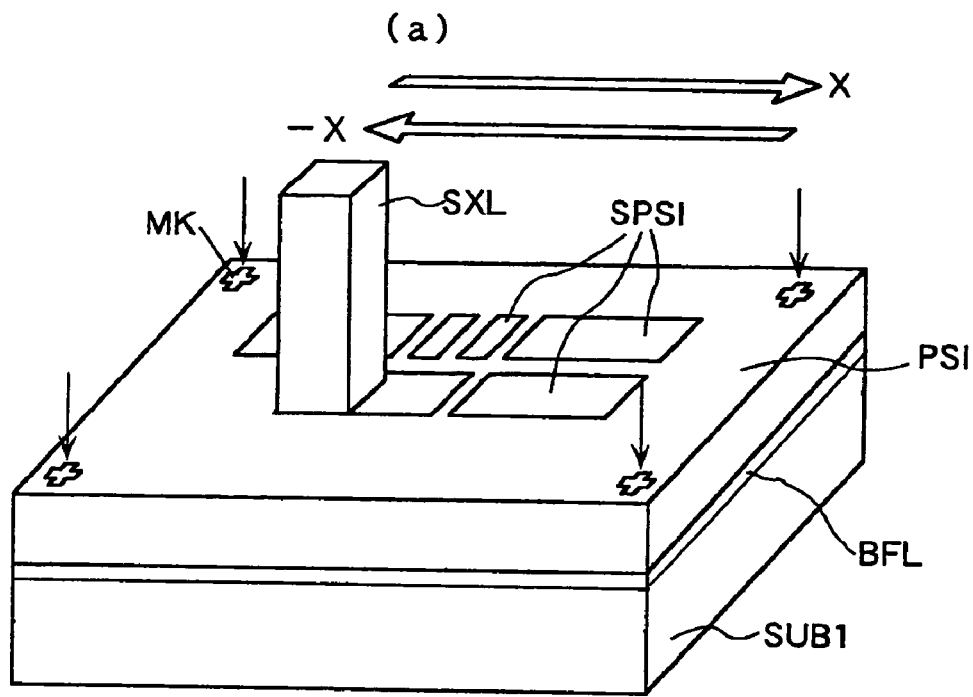
(b)
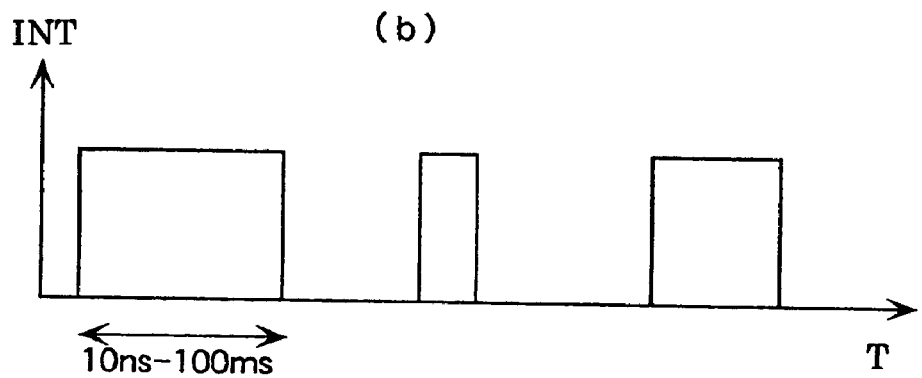
(c)
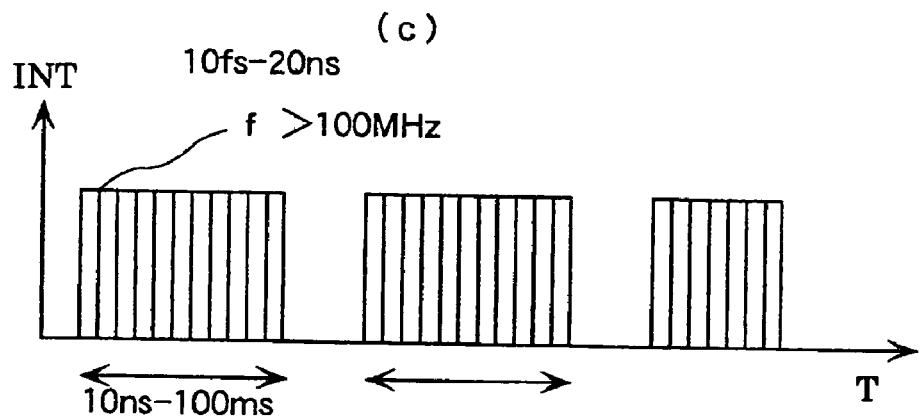

US 7,557,376 B2

DISPLAY DEVICE USING FIRST AND SECOND SEMICONDUCTOR FILMS OF DIFFERENT CRYSTALLINITY AND BOUNDARY SECTION THEREBETWEEN

CLAIM OF PRIORITY

The present application claims priority from Japanese Application JP 2005-277985 filed on Sep. 26, 2005, the content of which is hereby incorporated by reference into this application.

FIELD OF THE INVENTION

The present invention is suitably applicable to an image display device and, more particularly, to an image display device in which the crystallinity of a semiconductor film formed on an insulating substrate is reformed to a strip-like crystalline structure with a laser beam and each drive circuit comprising an active element and others is formed using the reformed semiconductor film.

BACKGROUND OF THE INVENTION

Widely used active matrix image display devices comprise a matrix of active elements to constitute the drive system which drives the pixels arranged in a matrix form. Usually, in this kind of image display device, a great number of pixel circuits, each provided with an active element such as a thin film transistor (TFT) formed using a silicon semiconductor film, and drive circuits on an insulating substrate, making it possible to display high quality images. The following description will be made on the assumption that the active element is a thin film transistor (TFT) as a typical example.

Conventionally, the above-mentioned thin film transistor is formed using a noncrystalline (amorphous) silicon semiconductor film. However, such an amorphous silicon film is difficult to constitute a high speed/function circuit since the performance of the thin film transistor is limited as represented by the carrier (electron or hole) mobility. To provide a better image quality by realizing high mobility thin film transistors, it is effective to reform (crystallize) the amorphous silicon film to a polysilicon film (polycrystalline silicon film) before the thin film transistors are formed. This reformation is made by using the laser annealing method which irradiates the amorphous silicon film with a laser beam such as an excimer laser beam.

With reference to FIGS. 8(a) and 8(b), the following provides a description of the laser annealing reformation method which uses an excimer laser. FIGS. 8(a) and 8(b) schematically show how an amorphous silicon film is crystallized by a scanning excimer pulse laser which is used most commonly in this method. FIG. 8(a) illustrates the configuration of an insulating substrate SUB on which a semiconductor film to be irradiated is formed. FIG. 8(b) shows how the reformation is performed by laser irradiation. Glasses or ceramics are used for the insulating substrate SUB.

In FIGS. 8(a) and 8(b), the insulating substrate SUB has an amorphous silicon film ASI deposited thereon via an underlying film BFL (SiO/SiN or the like). A linear excimer laser beam ELA having a width of several ten to hundred nanometers is used to anneal the amorphous silicon film ASI. By moving the irradiation position intermittently every one or several pulses in one direction (x direction) as indicated by the arrow, the whole amorphous silicon film ASI over the insulating substrate SUB is reformed to a polysilicon film PSI.

By performing various processes, such as etching, interconnect patterning and ion implantation, on the polysilicon film (grained crystalline silicon film) PSI obtained by the above-mentioned reformation method, a circuit composed of thin film transistors and others is formed. The resulting insulating substrate (active matrix substrate) SUB is used to manufacture an active matrix image display device such as a liquid crystal display device or an organic EL display device.

Providing a partial plan view of the portion irradiated with the laser beam shown in FIGS. 8(a) and 8(b), FIGS. 9(a) and 9(b) show how a thin film transistor is constructed. In FIG. 9(a), a thin film transistor fabrication section TRA is indicated. In FIG. 9(b), a thin film transistor is fabricated by patterning the thin film transistor fabrication section TRA of FIG. 9(a). As shown in FIG. 9(a), numerous crystallized silicon grains (grain-crystalline or micro-crystalline silicon semiconductor) ranging in size from 0.05 to 0.5 μm have grown uniformly to form the polycrystalline semiconductor film PSI across the portion irradiated with the laser beam. Each of most silicon semiconductor-grains (silicon crystals) has a closed grain boundary (between it and any adjacent silicon grain around it). The conventional reformation of a silicon film means such crystallization.

To form a pixel circuit or a drive circuit by using the above-mentioned reformed silicon film (polysilicon film PSI), etching is performed so that the transistor section TRA is left as a silicon film island PSI-L while the surrounding unnecessary section is all removed. Then, a gate insulating film (not shown in the figure), a gate electrode GT, a source electrode SD1, a drain electrode SD2 and others are deposited on the island PSI-L to form a thin film transistor.

The above-mentioned excimer laser annealing intends to improve the operating performance of active elements such as thin film transistors by allowing the active elements to be formed using a polysilicon film on an insulating substrate. However, this can not limitlessly raise the carrier (electron or hole) mobility in the channel of each thin film transistor since each of the crystal grains grown by excimer laser irradiation has a closed grain boundary as described above with reference to FIG. 9(b). In the channel between the source electrode and the drain electrode, movement of carriers is impeded due to these grain boundaries. This imposes a limit on the further improvement of the mobility. However, the circuit density of the drive circuitry is becoming larger with the recent trend toward higher definition. Thin film transistors or other active elements in an extremely dense drive circuitry are required to exhibit a much higher carrier mobility.

As a solution to this requirement, quasi-single crystallization technique is recently under study. In this technique, an amorphous or polycrystalline silicon film is scanned in a certain direction by a solid-state laser or the like. To develop laterally grown quasi-strip long semiconductor crystal grains in specific sections of the film, the film is selectively irradiated with the pulse-modulated continuous-wave (CW) or quasi-CW laser beam of the scanning laser.

FIGS. 10(a) to 10(c) are provided to explain how discrete sections are reformed to quasi-strip crystalline silicon film. FIG. 10(a) illustrates the scheme of this process. FIG. 10(b) shows an exemplary pulse-modulated output waveform of a continuous-wave laser while FIG. 10(c) is an exemplary output waveform of a quasi-CW laser. Use of "discrete" means that specific sections separate from each other are reformed by selectively irradiating the semiconductor film with the laser beam. Also note that these reformed discrete sections are denoted below as virtual tiles as the case may be. In FIG. 10(b) and FIG. 10(c), the horizontal axis represents the time T while the vertical axis represents the laser output intensity INT. The quasi-CW laser can substantially be used as a continuous-wave (CW) laser since its oscillation can be controlled at high frequencies beyond 100 MHz. In FIG. 10(b) and FIG. 10(c), light pulses each having a width of 10 ns to 100 ms are emitted by the continuous-wave laser and the quasi-CW laser through pulse modulation by an EO modulator. Below, either laser is denoted as a pulse-modulated laser.

The insulating substrate SUB1 has a buffer layer or underlying layer BFL thereon. To attain virtual tiles of quasi-strip crystalline silicon, the polysilicon film PSI formed on the underlying layer BFL is selectively irradiated with the pulse-modulated laser beam SXL shown in FIG. 10(b) or 10(c). The pulse-modulated laser beam SXL is emitted from a continuous wave laser as shown in FIG. 10(b) or from a quasi-CW laser as shown in FIG. 10(c). Each irradiation period continues for 10 ns to 100 ms. As shown in FIG. 10(a), the laser SXL is swept in the x direction over the polysilicon film PSI. Then, after shifted in the y direction, the laser SXL is swept in the -x direction. As a result, specific sections of the polysilicon film PSI are reformed to quasi-strip crystalline films SPSIs where long crystal grains are grown in the scanned directions x and -x. The insulating substrate SUB1 has an alignment mark MK thereon. This mark MK is used as an alignment target when the laser SXL is swept. Intermittent laser irradiation, while the substrate is scanned, makes it possible to arrange the quasi-strip crystalline silicon films SPSI like discrete tiles.

FIGS. 11(a) and 11(b) are provided to explain the crystalline structure of the quasi-strip crystalline silicon film. FIG. 11(a) schematically shows how the pulse-modulated laser SXL is swept. In FIG. 11(b), the crystallinity of the quasi-strip crystalline silicon film SPSI formed through irradiation by the pulse-modulated laser beam SXL is schematically shown in comparison with that of the remaining polysilicon film PSI which was not irradiated. As a result of reforming the crystallinity of the polysilicon film PSI by the scanning pulse-modulated laser SXL as shown FIG. 11(a), the quasi-strip crystalline silicon film SPSI is formed where single crystals are grown like strips extending in the scanning direction of the laser. Referential name CB indicates a grain boundary in the quasi-strip crystalline silicon film SPSI.

The average grain size in the quasi-strip crystalline silicon film SPSI is about 5 μm long in the scanning direction of the pulse-modulated laser beam SXL and about 0.5 μm wide in the direction perpendicular to the scanning direction (width of a grain boundary CB). The grain size in the scanning direction varies depending on the condition of the pulse-modulated laser SXL such as energy (power), scanning speed and pulse width. By contrast, the average grain size in the polysilicon film PSI is about 0.6 μm (0.3 to 1.2 μm). Due to such a different crystalline structure, the quasi-strip crystalline silicon film SPSI can substantially serve as a single crystal. Using the quasi-strip crystalline silicon film SPSI to fabricate a thin film transistor makes it possible to attain a high electron mobility beyond 300-500 $cm^2/V \cdot s$ since the movement of carriers is not impeded by grain boundaries if the length direction of crystal grains is aligned to the direction of electrical current. Electron mobility in the polysilicon film PSI is about 120 $cm^2/V \cdot s$ at highest.

In Patent Documents 1, 2, 3 and 4, prior art techniques are disclosed which concern the crystallization of silicon films to quasi-strip crystalline silicon and display devices in which thin film transistors are formed using quasi-strip crystalline silicon films.

[Patent Document 1]
Japanese Patent Laid-Open No. 1999-121753

[Patent Document 2]
Japanese Patent Laid-Open No. 2002-222957

[Patent Document 3]
Japanese Patent Laid-Open No. 2003-179068

[Patent Document 4]
Japanese Patent Laid-Open No. 2004-54168

SUMMARY OF THE INVENTION

The prior-art techniques disclosed in the above-cited documents concern the formation and arrangement of quasi-strip crystalline sections, the arrangement of thin film transistors (MOS transistors) in a quasi-strip crystalline section and the crystal orientations of quasi-strip crystalline sections from the view point of a larger layout margin. However, nothing is mentioned about the dependence of the layout margin on the boundary between a quasi-strip crystalline section and a non-reformed polysilicon section (grain-crystalline silicon film section). That is, although a quasi-strip crystalline section has a 2 to 10 um-wide boundary, this boundary is not taken into consideration when the arrangement of thin film transistors is determined.

It is not possible to dispose thin film transistors in the boundary of the quasi-strip crystalline section. Standing in the way of raising the integration density, this limits the circuit layout flexibility and circuit area reduction. In the case of an active matrix substrate, since the drive circuit must be formed directly on the substrate, it is required to reduce the circuit area so that the unit drive circuit can be repeated at the pixel pitch.

It is an object of the present invention to provide a display device capable of raising its integration density by reducing the drive circuit area on the active matrix substrate. Note that the application of the present invention is not limited to insulating substrates in image display devices where semiconductor films formed on the substrates are reformed. For example, the present invention is similarly applicable to a silicon wafer on which a semiconductor film is formed and partly reformed.

To solve the above-mentioned problem, the present invention partly or wholly uses the boundary of a quasi-strip crystalline section as a conductive line and/or resistor connected to the thin film transistor. The boundary of a quasi-strip crystalline section means a boundary either between quasi-strip crystalline sections, between a quasi-strip crystalline section and a polysilicon section or between a quasi-strip crystalline section and an amorphous silicon section.

Generally, each quasi-strip crystalline section is rectangular. This rectangular quasi-strip crystalline section is used to form circuit elements required to drive pixels. Preferably, each active element such as a thin film transistor to drive a pixel is designed so that its channel direction is parallel to the grain boundaries in the quasi-strip crystalline silicon film. Preferably but not exclusively, each quasi-strip crystalline silicon film is created through pulse-modulated irradiation by a continuous-wave or quasi-CW laser. This method is called SELAX (Selectively Enlarging Laser Crystallization). Note that the present invention is also applicable where a similar structure is created by another method.

Preferably, an insulating substrate (active matrix substrate) which constitutes a display device according to the present invention has a polysilicon film formed in each pixel area thereof and has a quasi-strip crystalline silicon film formed in each drive circuit area thereof. To form this polysilicon film, an amorphous silicon film is formed by the CVD or sputtering method and reformed to polysilicon by excimer laser irradiation. Quasi-strip crystalline silicon sections are formed by further reforming the crystallinity of the polysilicon film through pulse-modulated irradiation by a continuous-wave or quasi-CW laser. Here, "pulse-modulated" means that the irradiation pulse is changed in width and/or interval. Such modulated pulses can be obtained through electro-optic (EO) modulation of a CW (continuous-wave) or quasi-CW laser.

Note that the present invention is also applicable where the amorphous silicon film is left in each pixel area. In addition, the present invention is also applicable where each drive circuit area is directly reformed to quasi-strip crystalline silicon from amorphous silicon through pulse-modulated irradiation by a continuous-wave or quasi-CW laser without performing the intermediary reformation to a polysilicon film.

Further, the present invention is also applicable where reformation to quasi-strip crystalline silicon is done without pulse modulation. Each reformed section can be created by simply scanning the section with a continuous-wave laser beam or the like and the reformed section has a boundary.

Typical configurations according to the present invention are listed below:

(1) A display device comprising: a first semiconductor film which is strip-like crystalline; a second semiconductor film whose crystallinity is different from that of the first semiconductor film and which occupies a two dimensional space not occupied by the first semiconductor film; and a thin film transistor which uses the first semiconductor film to form the channel region thereof, wherein:

the thin film transistor has a conductive line or resistor connected thereto; and a semiconductor film present in the boundary section between the first semiconductor film and the second semiconductor film is used to form at least a part of the conductive line or resistor.

(2) A display device as described in (1), wherein the second semiconductor film is grain-crystalline or micro-crystalline.

(3) A display device comprising: a first semiconductor film which is strip-like crystalline; a second semiconductor film which occupies a two dimensional space not occupied by the first semiconductor film; a third semiconductor film which is present in the boundary section between the first semiconductor film and the second semiconductor film and whose crystallinity is different from that of the first semiconductor film and; and a thin film transistor which uses the first semiconductor film to form the channel region thereof, wherein:

the thin film transistor has a conductive line or resistor connected thereto; and the third semiconductor film is used to form at least a part of the conductive line or resistor.

(4) A display device as described in (3), wherein the second semiconductor film is quasi-strip crystalline or non-crystalline.

Note that "strip-like crystalline" is used to indicate almost the same meaning as "quasi-strip crystalline".

The present invention is applied to, for example, an active matrix substrate on which quasi-strip crystalline silicon films are prepared as silicon films to form a drive circuit around each pixel area. The quasi-crystalline silicon films are prepared by irradiating specific sections of a silicon film by a continuous-wave laser or the like to selectively reform the silicon film. Since the boundary between each quasi-strip crystalline film and a non-reformed semiconductor film can be used effectively, it is possible to improve the space utilization and raise the circuit layout flexibility.

Further, since the circuit fabrication space on the substrate can be used more efficiently, the area to be irradiated for reformation to quasi-strip crystalline semiconductor can be reduced. This makes it possible to miniaturize laser irradiation apparatus and raise the throughput. Therefore, it is possible to provide a high performance display device having a high speed circuit with high electron mobility.

The present invention is also applicable to active matrix substrates for organic EL display devices, making it possible to provide high image quality organic EL display devices at low costs. In addition, the present invention is applicable not only to active matrix liquid crystal display devices and organic EL display devices but also to other types of active matrix image display devices which have the same structure in their drive circuits. Further, the present invention can also be applied to semiconductor devices which are integrated on a semiconductor wafer.

BRIEF DESCRIPTION OF THE DRAWINGS

FIGS. 9(a) and 9(b) provide a partial plan view of the portion irradiated with the laser beam shown in FIGS. 8(a) and 8(b) and show how a thin film transistor is constructed;

FIGS. 10(a) to 10(c) are provided to explain how discrete sections are formed to quasi-strip crystalline silicon.

DETAILED DESCRIPTION OF THE PREFERRED EMBODIMENTS

The following will provide a detailed description of embodiments of the present invention with reference to the drawings of the embodiments.

Figure 1:
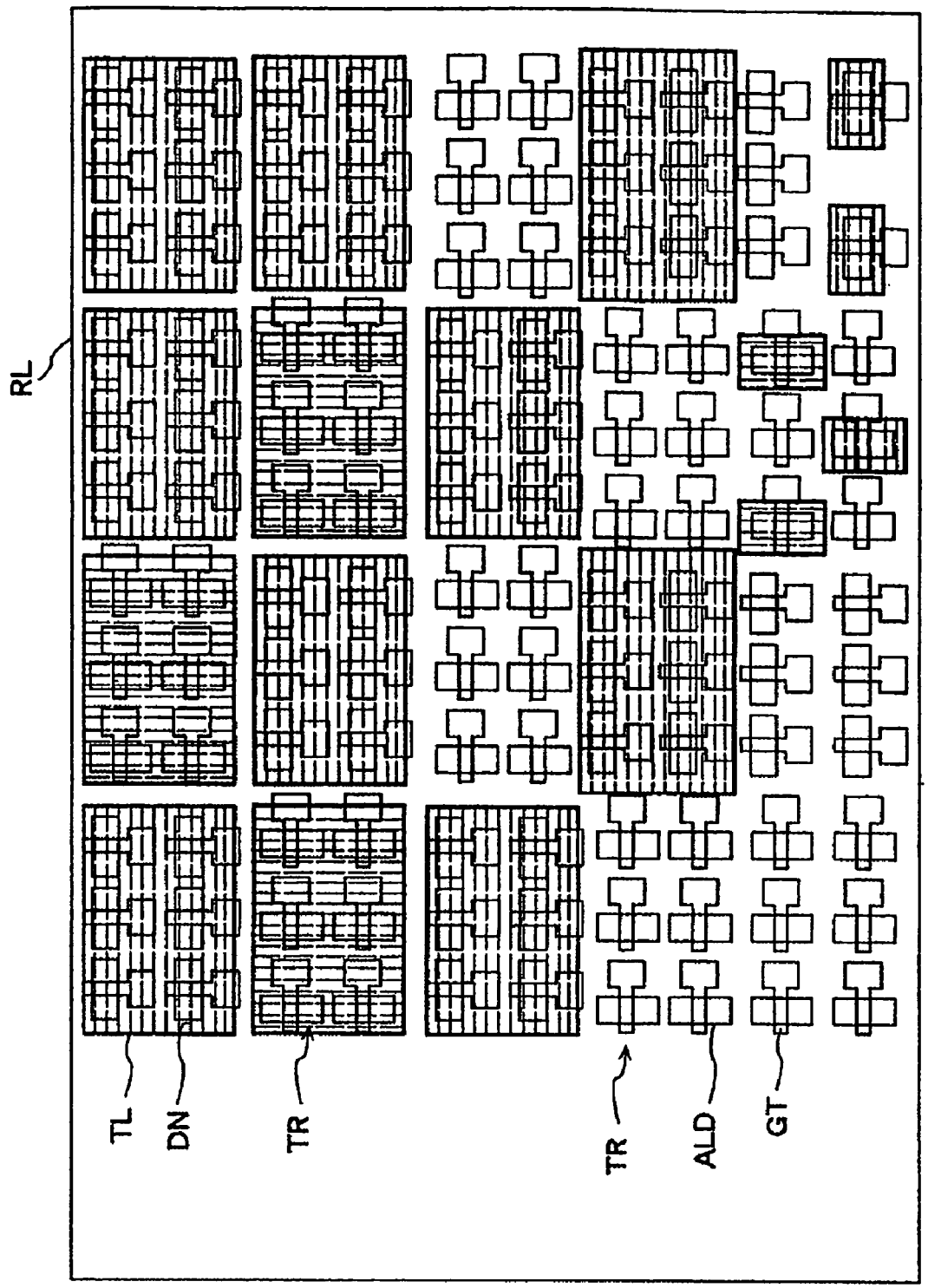
FIG. 1 is a schematic exemplary diagram to explain how quasi-strip crystalline sections are disposed in a part of the drive circuit section of an active matrix substrate which constitutes a display device of the present invention.

FIG. 1 is a schematic exemplary diagram to explain how quasi-strip crystalline sections are disposed in a part of the drive circuit section of an active matrix substrate which constitutes a display device of the present invention. Of a polysilicon film section (grain crystalline section) RL formed by applying excimer laser annealing to an amorphous silicon film, specific sections are further reformed to quasi-strip crystalline sections TLs by irradiating these sections with a scanning continuous-wave laser. In FIG. 1, each rectangle drawn with a thick line indicates a quasi-strip crystalline section TL. Dashed lines DN therein indicate the crystal orientation DN of quasi-strip crystals (length direction of crystal grains) which is along the scanning direction of the laser. Usually, the quasi-strip crystalline rectangular sections TLs have their longer sides in the scanning direction of the laser.

Each rectangle drawn with a thin line indicates a silicon island ALD prepared through photolithography and etching to form a thin film transistor by using it. In this figure, only the gate electrode GT of the thin film transistor is shown with the silicon island ALD. Each thin film transistor formed using a quasi-strip crystalline silicon film has a high mobility since the source and drain of the thin film transistor are disposed so that electrical current flows along the crystal orientation DN of the silicon island ALD.

Figure 2:
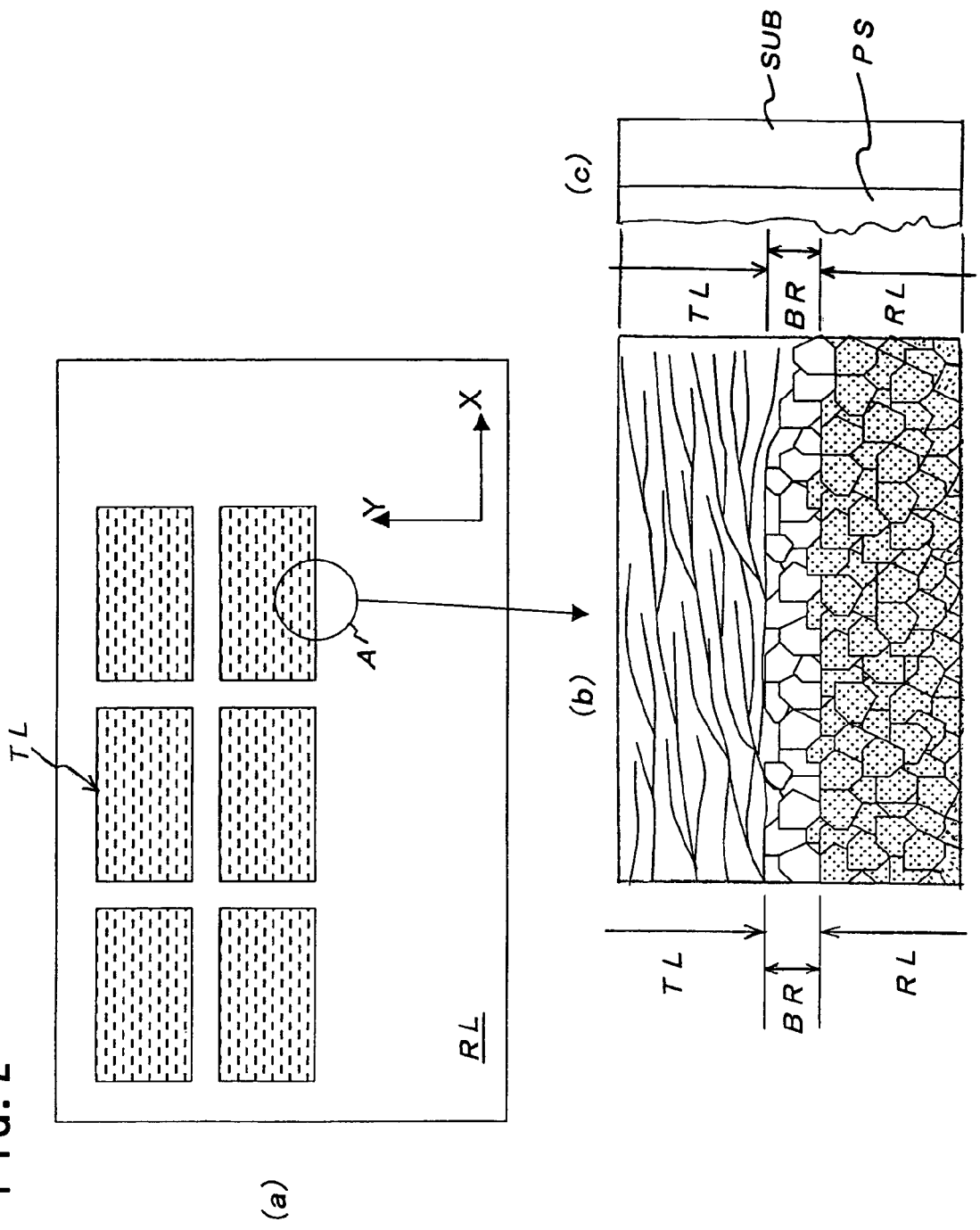
FIGS. 2(a) to 2(c) schematically show, to explain a first embodiment, the boundary of a quasi-strip crystalline section TL and the other crystalline section RL.

To explain a first embodiment, FIGS. 2(a) to 2(c) schematically show the boundary of a quasi-strip crystalline section TL and the other crystalline section RL. In FIG. 2(b), portion A of FIG. 2(a) is enlarged. FIG. 2(a) provides a sectional view of portion A. In FIG. 2(a), the crystal orientation of each quasi-strip crystalline section TL is along the x direction. There exists a boundary section BR between the grain crystalline section RL and each quasi-strip crystalline section TL formed in the grain crystalline section RL. The quasi-strip crystalline section TL has a relatively flat surface while the uneven surface of the grain crystalline section RL is attributable to silicon crystal grains therein. In geometry, the boundary section BR is intermediate between them. The boundary section BR is about 2 μm wide. The semiconductor crystallinity in this boundary section BR is grain crystalline or microcrystalline not quasi-strip crystalline.

Note that the present invention is also applicable where the different-crystallinity section RL is a micro-crystalline or amorphous semiconductor film. In this case, the boundary section BR becomes grain-crystalline or micro-crystalline since the boundary section BR is heated when the quasi-strip crystalline section TL is formed.

In addition, the present invention is also applicable where the boundary section BR is between a first quasi-strip crystalline section TL and a second quasi-strip crystalline section TL. The crystal orientation of the first quasi-strip crystalline and the crystal orientation of the second quasi-strip crystalline can be different or the same as shown in FIG. 1. For example, such a boundary section BR is formed if a section is reformed to a quasi-strip crystalline section TL by such continuous-wave laser irradiation that a part of an already reformed section is irradiated again. Also in this case, the boundary semiconductor section BR becomes grain-crystalline or micro-crystalline due to incomplete reformation.

Figure 3:
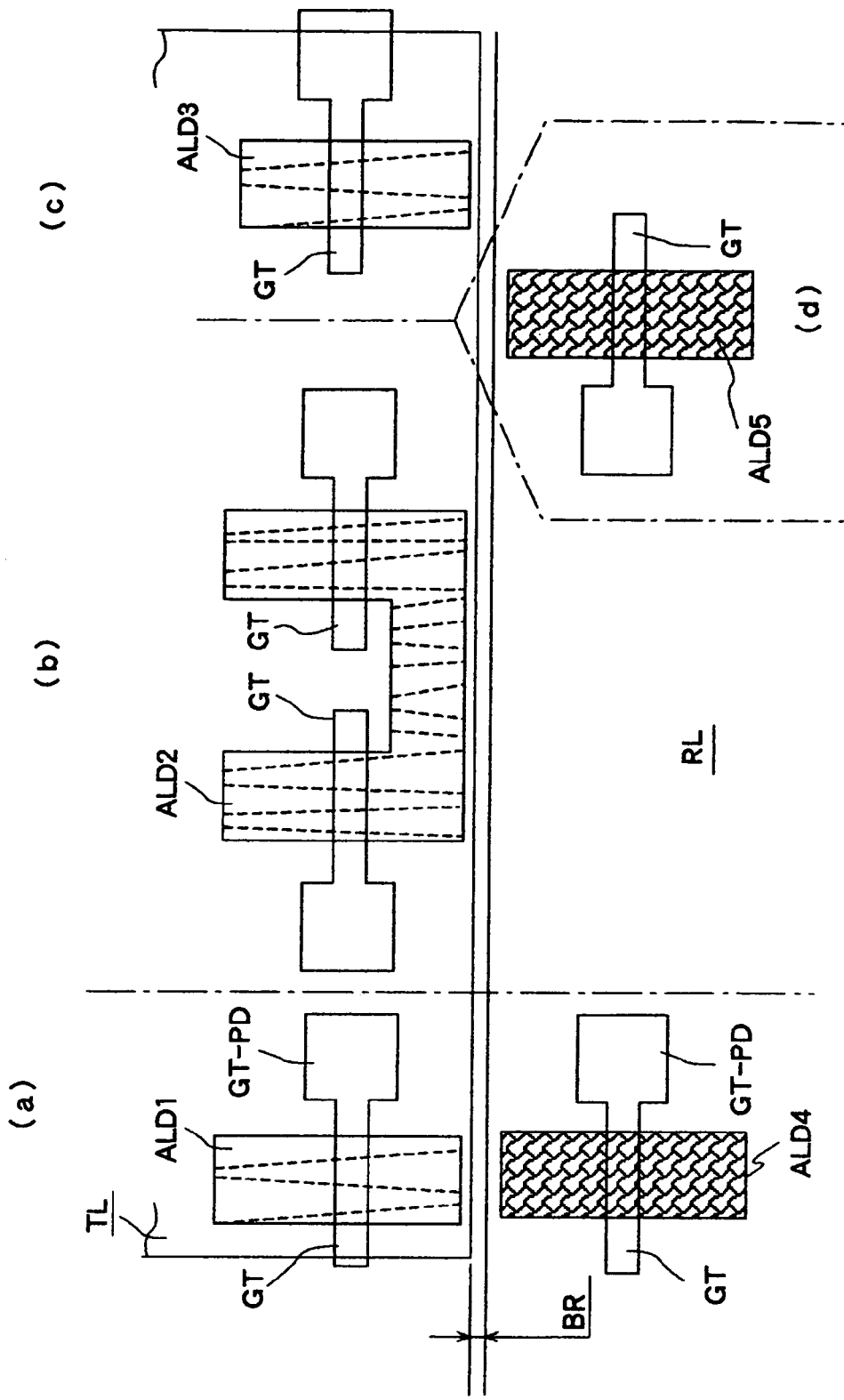
FIGS. 3(a) to 3(d) schematically show exemplary conventional layouts of thin film transistors in a substrate area having a quasi-strip crystalline section TL and a different-crystallinity section RL thereon as shown in FIGS. 2(a) to 2(c)

FIGS. 3(d) to 3(d) schematically show an exemplary conventional layout of thin film transistors in a substrate area having a quasi-strip crystalline section TL and a different-crystallinity section RL thereon as shown in FIGS. 2(a) to 2(c). In the quasi-strip crystalline area TL, shown in the upper section of FIGS. 3(d) to 3(d), silicon islands ALD1 (a), ALD2 (b) and ALD3 (c) are formed for high speed operation thin film transistors.

Dashed lines within the silicon islands ALD1, ALD2 and ALD3 indicate grain boundaries of quasi-strip crystalline silicon. In the different-crystallinity section, namely grain-crystalline section RL, shown in the lower section of FIGS. 3(d) and 3(b), silicon islands ALD4 and ALD5 are formed for thin film transistors which are not required to operate at high speed. On these silicon islands, gate electrodes GT and source/drain electrodes (not shown in the figure) are formed. Note that each gate electrode GT is connect to a gate line (not shown in the figure) via a gate pad GT-PD.

This layout does not use the boundary section BR which exists between the quasi-strip crystalline section TL and the grain-crystalline crystalline section RL. The semiconductor film of the boundary section BR is removed by patterning and therefore not used as circuit components. That is, the boundary section BR of about 2 μm in width is a space of no use and serves as a factor to restrict the flexibility of layout of the thin film transistor circuitry.

Embodiment 1

FIGS. 4(a) to 4(d) schematically show a first embodiment, a layout of thin film transistors in a substrate area having a quasi-strip crystalline section TL and a different-crystallinity section RL thereon as shown in FIGS. 2(a) to 2(c). In FIGS. 4(a) to 4(d), each component which has the same function as the corresponding one in FIGS. 3(a) to 3(d) are given the same referential name as in FIGS. 3(a) to 3(d). In the first embodiment, silicon islands ALD1, ALD2, ALD3 and ALD6 are formed by patterning one quasi-strip crystalline section TL. As well, silicon islands ALD4, ALD5, ALD7 and ALD8 are formed by patterning the different-crystallinity section RL. The semiconductor film of the boundary section BR is partly left.

Figure 4:
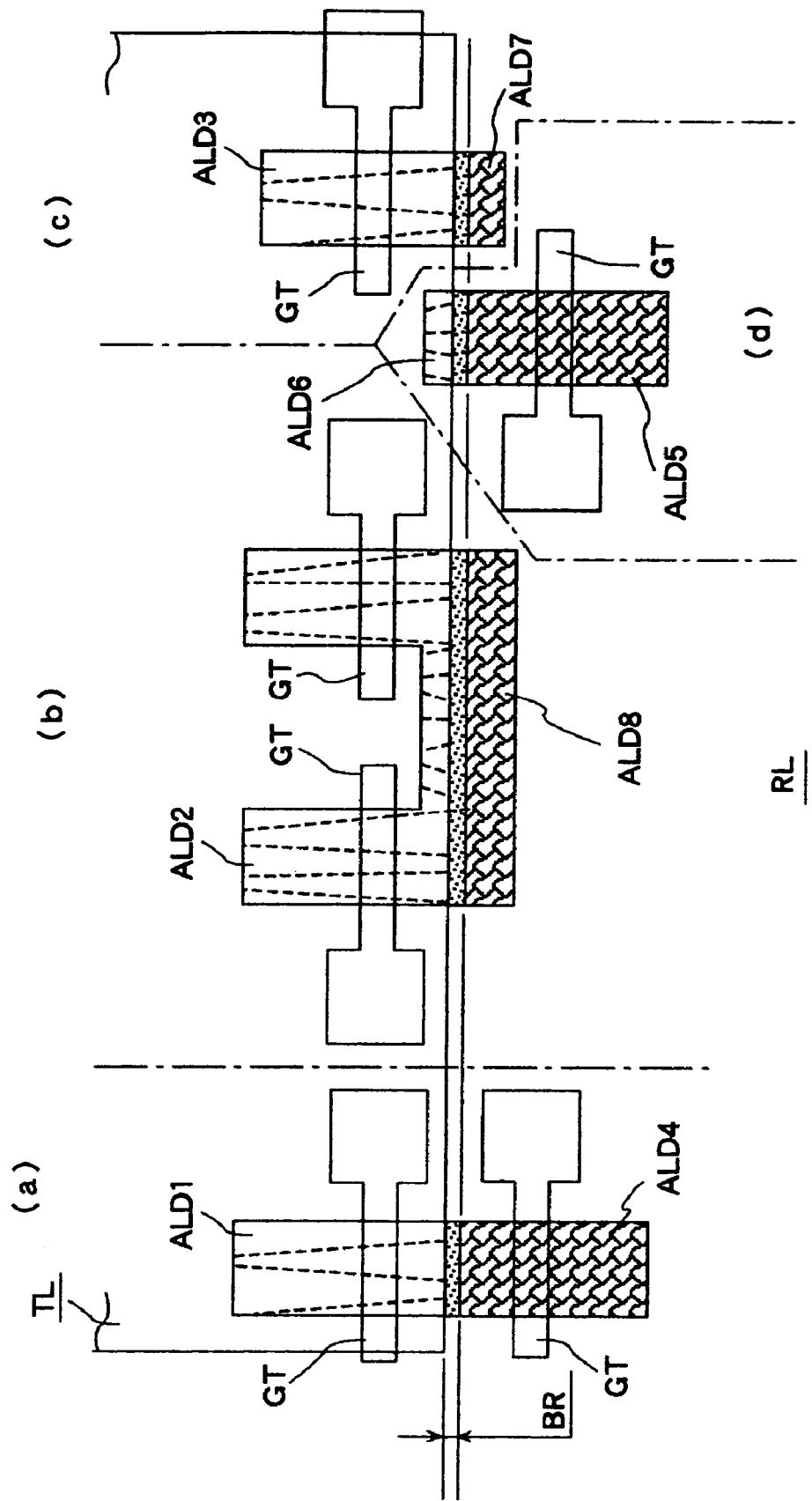
FIGS. 4(a) to 4(d) schematically show the first embodiment, a layout of thin film transistors in a substrate area having a quasi-strip crystalline section TL and a different-crystallinity section RL thereon as shown in FIGS. 2(a) to 2(c)

In FIG. 4(a), the island ALD1 in the quasi-strip crystalline section TL and the island ALD4 in the grain-crystalline section RL are integrated as a single island via the boundary section BR. That is, a conductive line or resistor which connects the thin film transistor of the island ALD1 and the thin film transistor of the island ALD2 is formed by using the semiconductor film of the boundary section BR. In the case of FIG. 3(d), another layer is necessary to form a conductive line or resistor which connects these thin film transistors. The present invention makes this unnecessary.

In addition, in the case of FIG. 4(a), the two thin film transistors can be located nearer to the boundary section BR than in FIG. 3(d). This makes it possible to reduce the layout area.

In FIG. 4(b), the island ALD2 ("C"-shaped) in the quasi-crystalline section TL and the island ALD8 in the grain-crystalline section RL are integrated as a single island via the boundary section BR. Also in this case, the semiconductor film of the boundary section BR is used to form a conductive line or resistor which connects the two thin film transistors. This makes it possible to locate the thin film transistors near the boundary section BR between the quasi-strip crystalline section TL and the grain-crystalline section RL and eliminate the unnecessary space.

In FIG. 4(c), the island ALD3 in the quasi-strip crystalline section TL and the island ALD7 in the grain-crystalline section RL are integrated as a single island via the boundary section BR. In FIG. 4(d), the island ALD6 in the quasi-strip crystalline section TL and the island ALD5 in the grain-crystalline section RL are integrated as a single island via the boundary section BR. Either in FIG. 4(c) or 4(d), the semiconductor film of the boundary section BR is used as a source or drain region of a thin film transistor. Use of the semiconductor film of the boundary section BR does not have substantial influence on the performance unless the film is used to form the channel region of the transistor. As well, this layout makes it possible to locate thin film transistors near the boundary section BR between the quasi-strip crystalline section TL and the grain-crystalline section RL and eliminate the unnecessary space.

Thus, according to the first embodiment, it is possible to more efficiently use the circuit fabrication space on the active matrix substrate and therefore allows the display device more flexible circuit layout.

Embodiment 2

FIGS. 5(a) to 5(d) schematically show a second embodiment, a layout of thin film transistors in a substrate area having quasi-strip crystalline sections TL and a different-crystallinity section RL thereon as shown in FIGS. 2(a) to 2(c). FIGS. 4(a) to 4(d) are different from FIGS. 2(a) to 2(c) only in that each quasi-strip crystalline section TL is smaller. In FIGS. 5(a) to 5(d), an island ALD1 is composed of three portions which are formed respectively from a quasi-strip crystalline section TL, a different-crystallinity section RL and a boundary section BR between them. Islands ALD2, ALD3 and ALD4 are also composed in the same manner.

Figure 5:
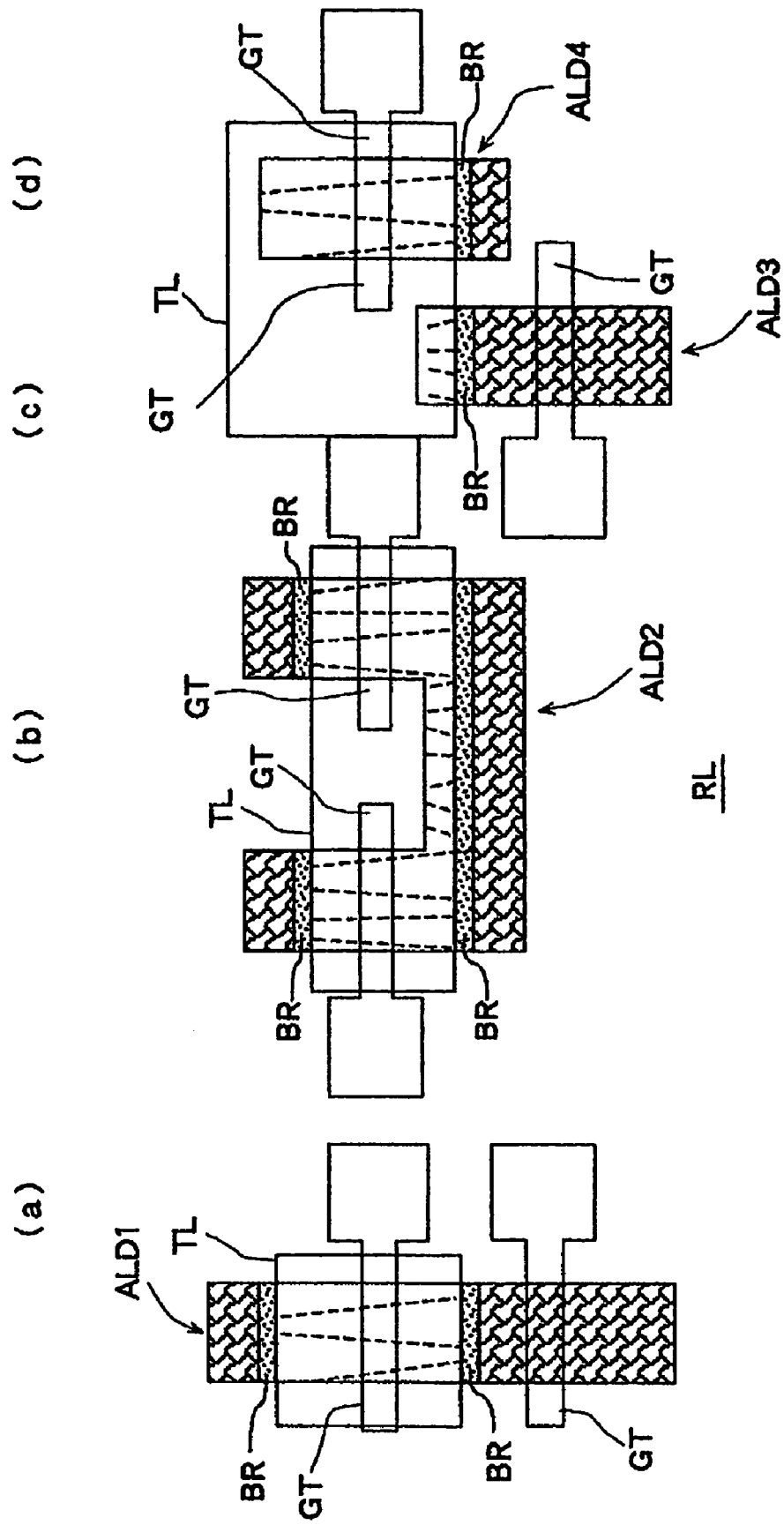
FIGS. 5(a) to 5(d) schematically show a second embodiment, a layout of thin film transistors in a substrate area having quasi-strip crystalline sections TL and a different-crystallinity section RL thereon as shown in FIGS. 2(a) to 2(c)

Each of the thin film transistors in FIGS. 5(a), 5(b) and 5(d) uses a quasi-strip crystalline section TL to form its channel region.

In addition, each of the thin film transistors in FIGS. 5(a) and 5(b) uses the semiconductor film of the boundary section BR as a part of the conductive line or resistor connected to its channel region.

According to the second embodiment, it is thus possible to more efficiently use the circuit fabrication space on the active matrix substrate and therefore allows the display device more flexible circuit layout.

Figure 6:
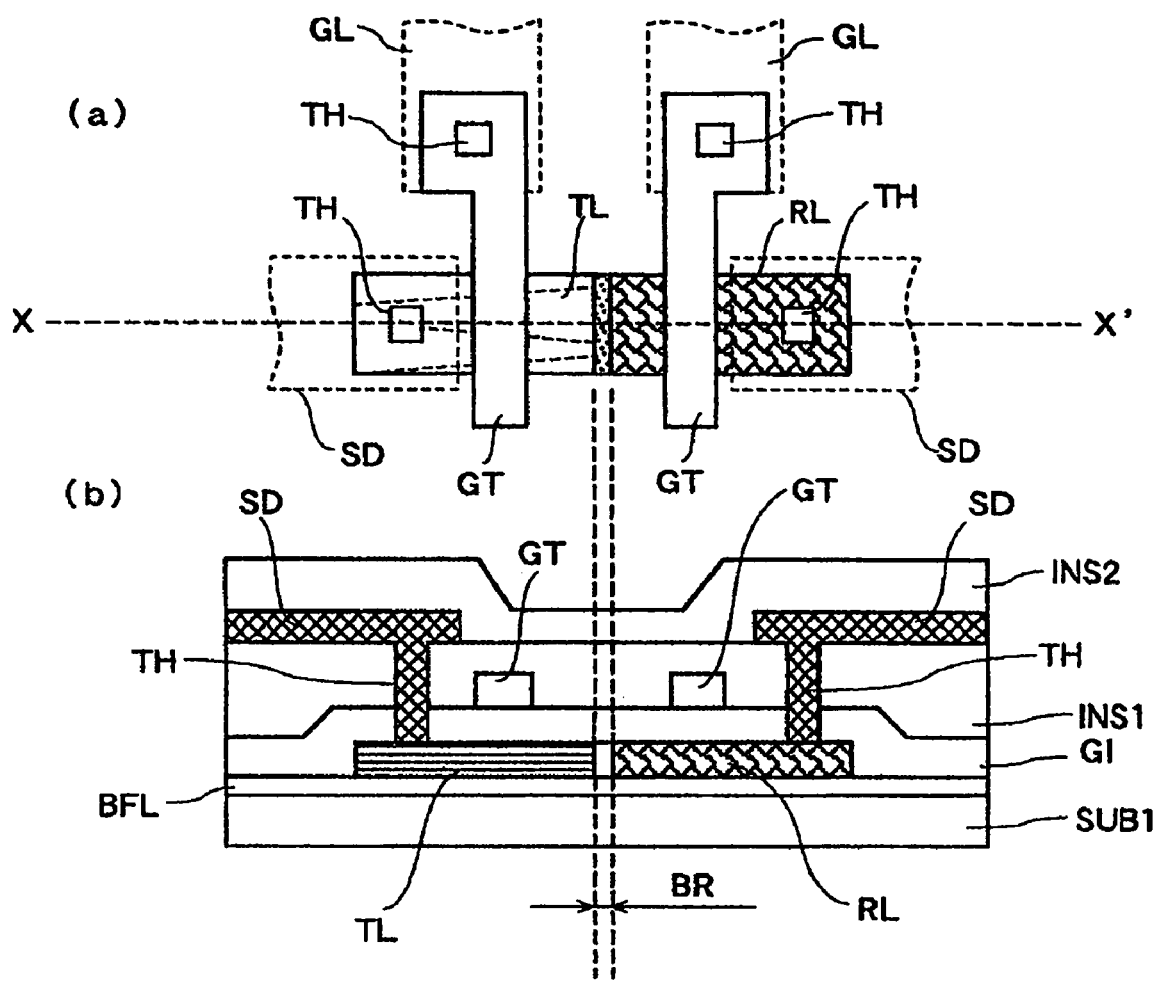
FIGS. 6(a) and 6(b) are schematic diagrams to explain the configuration of a thin film transistor circuit according to the present invention.

FIGS. 6(a) and 6(b) are schematic diagrams to explain the configuration of a thin film transistor circuit according to the present invention. FIG. 6(a) shows its top view while FIG. 6(b) shows its cross section along line x-x' in FIG. 6(a). In FIGS. 6(a) and 6(b), an underlying layer BFL is formed on an active matrix substrate SUB1. On the underlying layer BFL, a continuous island composed of an quasi-strip crystalline section TL, a grain-crystalline section RL and a boundary section BR between them is formed. That is, the semiconductor film in the boundary section BR is used as a part of the conductive line or resistor which connects the two thin film transistors. A gate electrode GT is formed on each crystalline section. To the source/drain region of each thin film transistor, a source/drain electrode (or a conductive line) SD is connected via a through hole TH opened through a gate insulation film GI and an interlayer insulation film INSI. On the source/drain electrodes SD, an insulating film INS2 is formed. Each gate electrode GT is connected to a gate line GL via a through hole TH.

Figure 7:
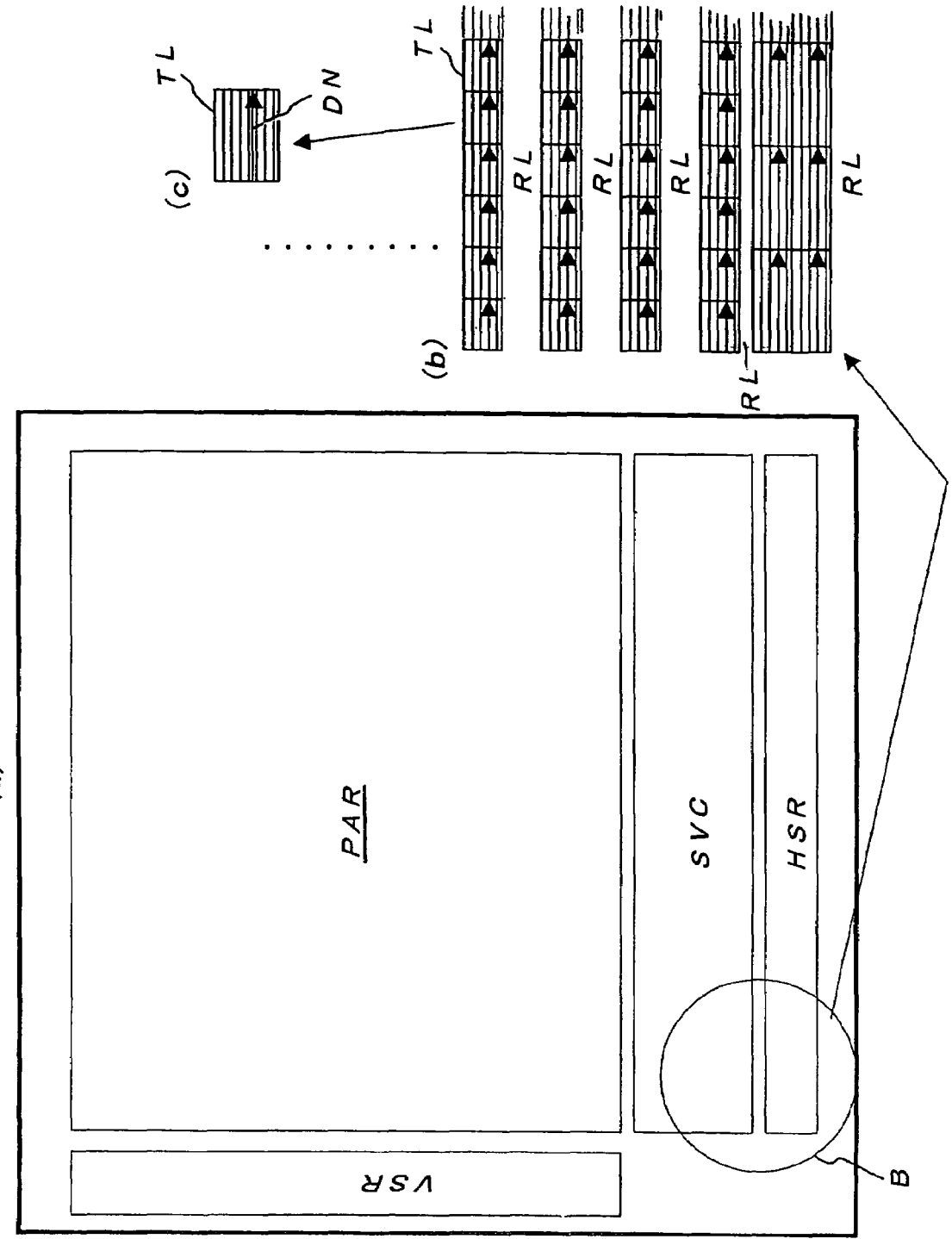
FIGS. 7(a) to 7(c) are schematic diagrams to explain the general layout of an active matrix substrate in a liquid crystal display device, a display device embodiment of the present invention.
Figure 8:
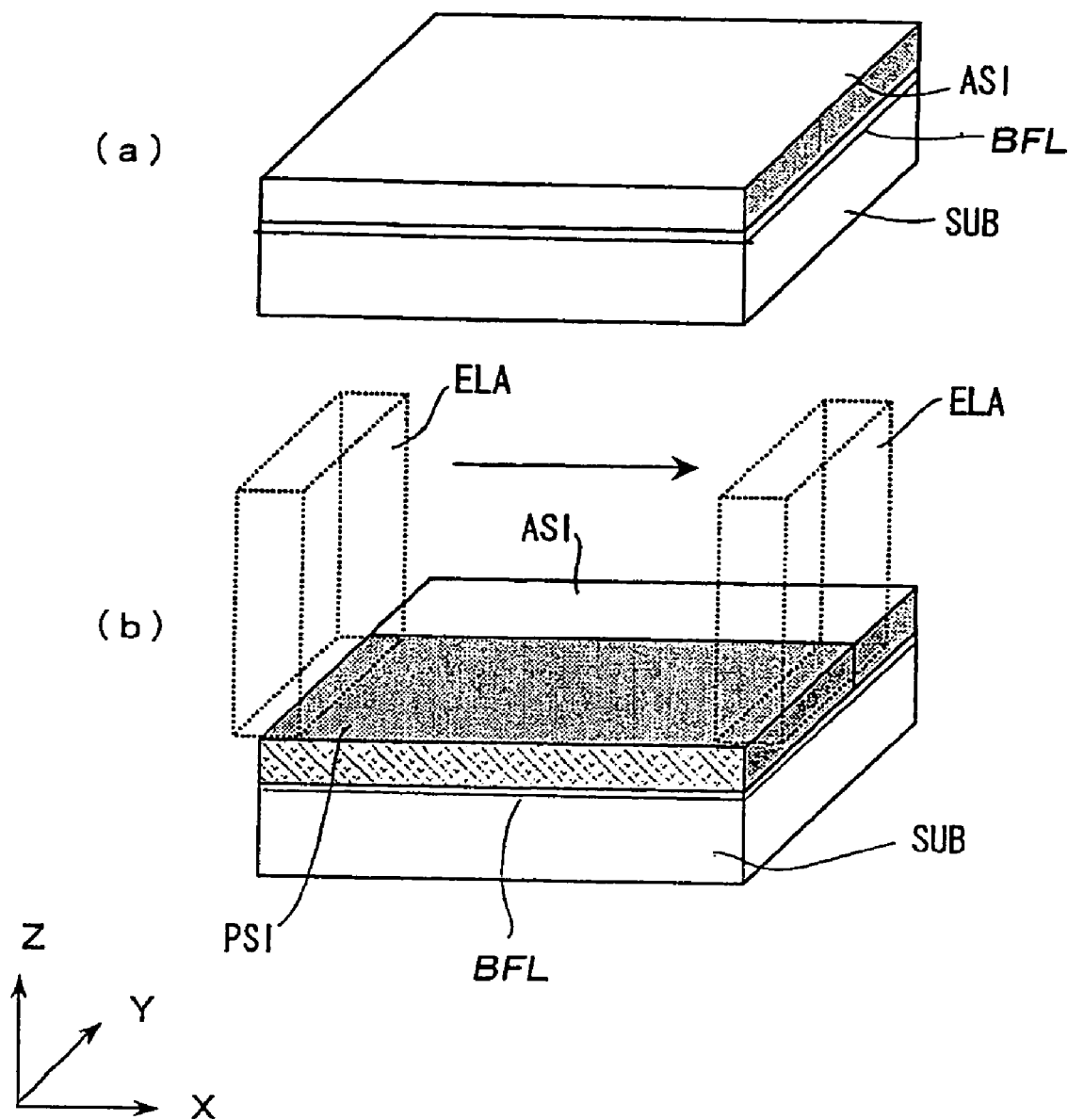
FIGS. 8(a) and 8(b) schematically show how an amorphous silicon film is crystallized by a scanning excimer pulse laser which is used most commonly.
Figure 11:
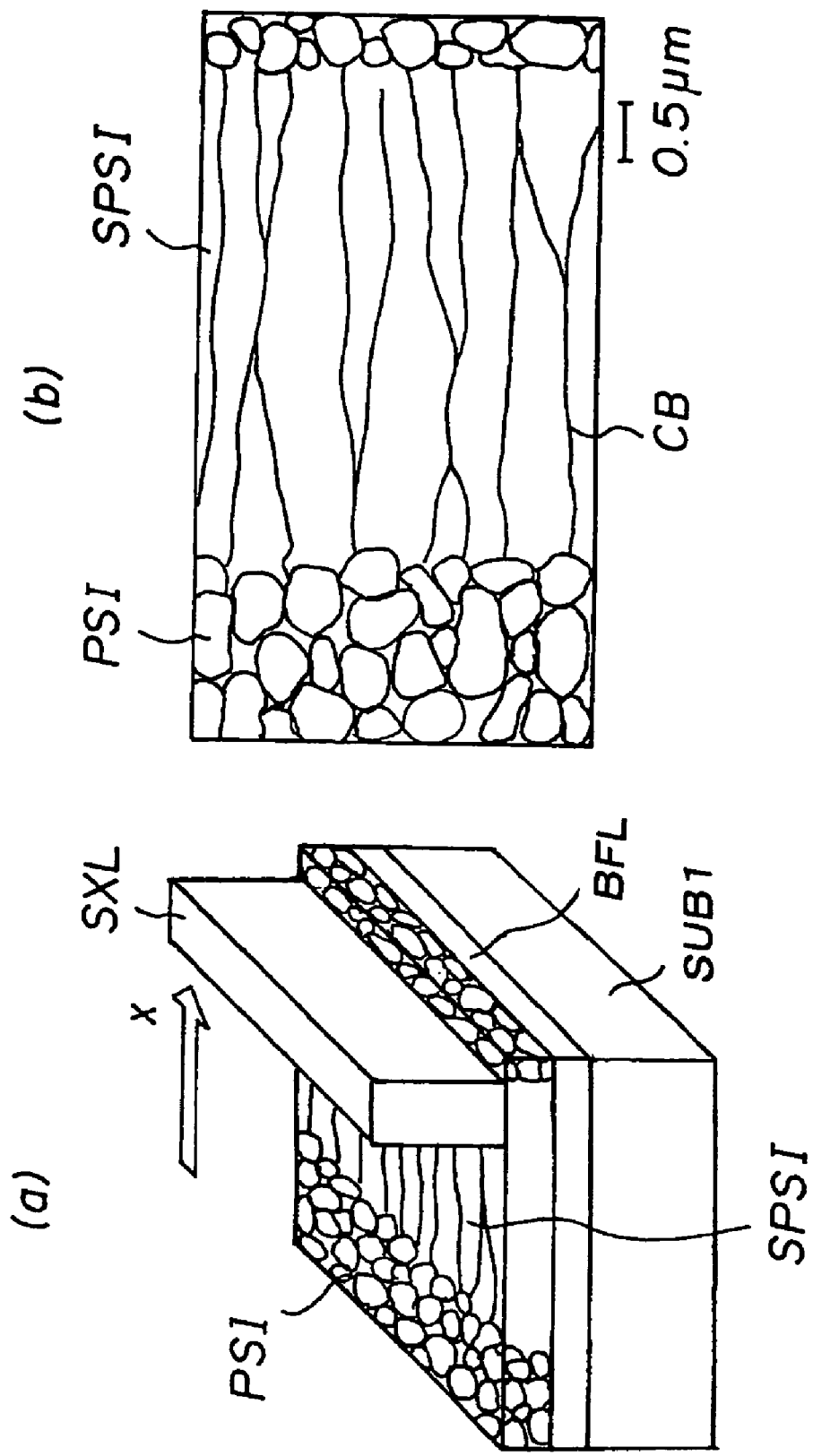
FIGS. 11(a) and 11(b) are provided to explain the crystalline structure of the quasi-strip crystalline silicon film.

FIGS. 7(a) to 7(c) are schematic diagrams to explain the general layout of an active matrix substrate in a liquid crystal display device, a display device embodiment of the present invention. FIG. 7(a) shows its top view. FIG. 7(b) provides an enlarged view of portion B shown in FIG. 7(a). FIG. 7(c) provides an enlarged view of a quasi-strip crystalline section TL shown in FIG. 7(b). Referring to FIG. 7(a), a gate driver (vertical scanning drive circuit) VSR, a data driver (horizontal scanning drive circuit HSR, a voltage drive circuit SVC) and other peripheral circuits are fabricated around a pixel area (effective display area) PAR. In this example, high speed operation thin film transistors are formed in the horizontal scanning drive circuit HSR and voltage select circuit SVC area and each boundary section between a quasi-strip crystalline section TL and a grain-crystalline section RL in this area is used to form conductive lines or resistors as described so far. Each arrow in the figure indicates the scanning direction taken there by the laser to form a quasi-crystalline section TL, namely the length direction of quasi-strip crystals.

Use of this active matrix substrate in a liquid crystal display device makes it possible to provide a compact display device having a large display screen since the peripheral circuit area around the pixel area can be reduced.

What is claimed is:

1. A display device comprising:
   a first semiconductor film composed of strip-like crystals;
   a second semiconductor film which occupies a two dimensional space not occupied by the first semiconductor film;
   a third semiconductor film which is present in a boundary section between the first semiconductor film and the second semiconductor film and whose crystallinity is different from that of the first semiconductor film and;
   a thin film transistor which uses the first semiconductor film to form a channel region of the thin film transistor; and;
   a conductive line or resistor connected to said thin film transistor;
   wherein:
   the third semiconductor film is used to form at least a part of the conductive line or resistor.

2. The display device according to claim 1 wherein the second semiconductor film is quasi-strip crystalline or non-crystalline.

3. A display device comprising:
   a first semiconductor film composed of strip-like crystals;
   a second semiconductor film which occupies a two-dimensional space not occupied by the first semiconductor film and whose crystallinity is different from that of the first semiconductor film;
   a boundary section between the first semiconductor film and the second semiconductor film;
   a first thin film transistor which uses the first semiconductor film to form a channel region of the first thin film transistor; and
   a second thin film transistor which uses the second semiconductor film to form a channel region of the second thin film transistor;
   wherein the first semiconductor film and the second semiconductor film constitute a continuous film.

4. A display device comprising:
   a first semiconductor film composed of strip-like crystals;
   a second semiconductor film which occupies a two-dimensional space not occupied by the first semiconductor film and whose crystallinity is different from that of the first semiconductor film;
   a boundary section between the first semiconductor film and the second semiconductor film;
   a first thin film transistor which uses the first semiconductor film to form a channel region of the first thin film transistor; and
   a second thin film transistor which uses the second semiconductor film to form a channel region of the second thin film transistor;
   wherein the first semiconductor film and the second semiconductor film constitute a continuous film via the boundary section.

5. The display device according to claim 4 wherein the first thin film transistor and the second thin film transistor are adjacent to each other and the first semiconductor film and the second semiconductor film constitute a continuous film via the boundary section.

6. A display device comprising:

a first semiconductor film composed of strip-like crystals;

a second semiconductor film which occupies a two-dimensional space not occupied by the first semiconductor film and whose crystallinity is different from that of the first semiconductor film;

a boundary section between the first semiconductor film and the second semiconductor film;

a first thin film transistor which uses the first semiconductor film to form a channel region of the first thin film transistor; and a second thin film transistor which uses the second semiconductor film to form a channel region of the second thin film transistor;

wherein a source or drain region of the first thin film transistor is formed in the boundary section.

7. A display device comprising:

a first semiconductor film composed of strip-like crystals;

a second semiconductor film which occupies a two-dimensional space not occupied by the first semiconductor film and whose crystallinity is different from that of the first semiconductor film;

a boundary section between the first semiconductor film and the second semiconductor film;

a first thin film transistor which uses the first semiconductor film to form a channel region of the first thin film transistor; and a second thin film transistor which uses the second semiconductor film to form a channel region of the second thin film transistor;

wherein a source or drain region of the second thin film transistor is formed in the boundary section.

8. A display device comprising:

a first semiconductor film composed of strip-like crystals oriented in a first direction;

a second semiconductor film which is in the vicinity of the first semiconductor film and composed of strip-like crystals oriented in a second direction differing from the first direction;

a boundary section between the first semiconductor film and the second semiconductor film;

a first thin film transistor which uses the first semiconductor film to form a channel region of the first thin film transistor; and a second thin film transistor which uses the second semiconductor film to form a channel region of the second thin film transistor;

wherein the first semiconductor film and the second semiconductor film constitute a continuous film.

* * * * *